United States Patent
Oumaru

(10) Patent No.: US 6,800,934 B2
(45) Date of Patent: Oct. 5, 2004

(54) POWER MODULE

(75) Inventor: Takeshi Oumaru, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/189,561

(22) Filed: Jul. 8, 2002

(65) Prior Publication Data

US 2003/0030481 A1 Feb. 13, 2003

(30) Foreign Application Priority Data

Aug. 8, 2001 (JP) ........................................ 2001-240738

(51) Int. Cl.[7] .............................................. H01L 23/34
(52) U.S. Cl. ...................... 257/723; 678/691; 678/780; 678/781; 678/784
(58) Field of Search ................................ 257/723, 678, 257/691, 780, 781, 784

(56) References Cited

U.S. PATENT DOCUMENTS

| | | | | |
|---|---|---|---|---|
| 5,642,253 A | * | 6/1997 | Shreve .......................... | 361/152 |
| 5,763,946 A | * | 6/1998 | Nakadaira et al. ........... | 257/693 |
| 5,767,576 A | * | 6/1998 | Kobayashi et al. .......... | 257/701 |
| 6,100,728 A | * | 8/2000 | Shreve et al. ................ | 327/110 |
| 6,479,327 B2 | * | 11/2002 | Takahashi et al. ........... | 438/124 |
| 6,541,838 B1 | * | 4/2003 | Suetsugu et al. ............ | 257/500 |

FOREIGN PATENT DOCUMENTS

| | | | | |
|---|---|---|---|---|
| DE | 19938302 A1 | * | 8/1998 | ........... H01L/25/07 |
| JP | 58-23469 | * | 2/1983 | |
| JP | 61-139051 | | 6/1986 | |
| JP | 6-334066 | | 2/1994 | |
| JP | 8-340082 | | 12/1996 | |
| JP | 11-238851 | | 8/1999 | |
| JP | 2001-7282 | | 1/2001 | |

* cited by examiner

*Primary Examiner*—Jasmine Clark
(74) *Attorney, Agent, or Firm*—Oblon, Spivak, McClelland, Maier & Neustadt, P.C.

(57) ABSTRACT

A power module having a plurality of power devices arranged in parallel with each other and switched by gate signals with substantially equal electric potential. The power module includes: a collector electrode pattern, first and second power devices provided on the collector electrode pattern and each having a collector electrode connected to the collector electrode pattern; an emitter electrode pattern provided along the collector electrode pattern and having an emitter lead, and first and second connection means for connecting emitter electrodes on the first and second power devices and the emitter electrode pattern, respectively. The power module is characterized in that an inductance component of at least one of the first and second connection means is adjusted so that the inductance component between the emitter electrode on the first power device and the emitter lead is substantially equal to that between the emitter electrode on the second power device and the emitter lead.

14 Claims, 5 Drawing Sheets

POWER MODULE

CROSS-REFERENCE TO RELATED APPLICATIONS

A related patent application is a commonly assigned Japanese Patent Application No. 2001-240738 filed on Aug. 8, 2001, which is incorporated by reference into the present patent application.

BACKGROUND OF THE INVENTION

1. Field of the Invention

The present invention relates to a power module, and more particularly to a power module having a plurality of insulated gate bipolar transistors (IGBTs) arranged in parallel with each other.

2. Description of the Related Art

FIG. 4 is a schematic view of a conventional power module indicated in its entirety as 500. The power module 500 includes a ceramic substrate 501. On the ceramic substrate 501, an emitter electrode pattern 502, a collector electrode pattern 503, and a gate electrode pattern 504 are provided in substantially parallel with each other. At each one end of the electrode patterns 502, 503, and 504, an emitter lead 512, a collector lead 513, and a gate lead 514 are provided, respectively.

Onto the collector electrode pattern 503, two insulated gate bipolar transistors (IGBTs) 521 and 522 are fixed. Each back face of the IGBTs 521 and 522 is a collector electrode. Each of the collector electrodes is electrically connected to the collector electrode pattern 503. Emitter electrodes on the front faces of the IGBTs 521 and 522 are connected to the emitter electrode pattern 502, via bonding wires 523 and 524, respectively. Gate electrodes on the IGBTs 521 and 522 are connected to the gate electrode pattern 504 via bonding wires 525 and 526, respectively. Furthermore, an emitter electrode on the IGBT 521 is connected to a ground electrode 528, via a bonding wire 527. Typically, a cover is placed over the ceramic substrate 501 to seal the IGBT 521 and other components. However, the cover is omitted in this drawing.

FIG. 5 shows a layout of the emitter electrode pattern 502 and the collector electrode pattern 503 of the power module of FIG. 4. In FIG. 5, like reference numerals refer to similar or corresponding parts shown in FIG. 4.

In such power module 500, the two IGBTs 521 and 522 are arranged in parallel with each other. Feeding signals into the gate electrode pattern 504 allows simultaneous switching of the two IGBTs 521 and 522, thereby supplying large current between the emitter electrode pattern 502 and the collector electrode pattern 503.

However, when the IGBTs 521 and 522 are switched, the inductance components generate counter electromotive force in the bonding wires 525 and 526, and the emitter electrode pattern 502.

First, suppose that electric potential at each point of P, Q, R, and S shown in FIG. 5 is 0 V (ground potential) in the initial state.

Next, the IGBTs 521 and 522 are switched using the bonding wires 525 and 526, respectively, and brought to the ON state. Immediately after switching, current flows from the point P to the point Q, from the point Q to the point R, and from the point S to the point R. Then, current flows through the emitter electrode pattern 502 in the direction shown by an arrow 530. At the same time, the inductance components cause voltage drop between the points P and Q, and the other points. As a result, unbalanced conditions occur in the gate-to-emitter voltages on the IGBTs 521 and 522. These unbalanced conditions cause a timing lag of switching the IGBTs 521 and 522.

For example, suppose that the electric potential at the point P is 0 V. Then, the electric potential at the point Q is −3 V and that at the point R is −5 V because of the influence of the voltage drop. On the other hand, voltage increases in the direction from the point R to the point S, and thus the electric potential at the point S is −2 V. Therefore, the gate-to-emitter voltages on the IGBTs 521 and 522 have different values of 15 V and 17 V respectively, immediately after the electric potential at the both gates are set to 15 V. This phenomenon causes a timing lag of switching the two IGBTs 521 and 522. Such a timing lag results in excessive load imposed on one of the IGBTs, which has been one of causes of failures and shorter lives of the IGBTs.

SUMMARY OF THE INVENTION

The object of the present invention is to provide a power module having a plurality of IGBTs arranged in parallel with each other and switched at the same timing.

The present invention provides a power module having a plurality of power devices arranged in parallel with each other and switched by gate signals with substantially equal electric potential. The power module includes: a collector electrode pattern, first and second power devices provided on the collector electrode pattern and each having a collector electrode connected to the collector electrode pattern; an emitter electrode pattern provided along the collector electrode pattern and having an emitter lead, and first and second connection means for connecting emitter electrodes on the first and second power devices and the emitter electrode pattern, respectively. The power module is characterized in that an inductance component of at least one of the first and second connection means is adjusted so that the inductance component between the emitter electrode on the first power device and the emitter lead is substantially equal to that between the emitter electrode on the second power device and the emitter lead.

Also, the present invention provides a power module further including: a third power device provided on the collector electrode pattern in symmetrical relation with the first power device so as to sandwich the second power device together, and having a collector electrode connected to the collector electrode pattern, and a third connection means for connecting an emitter electrode on the third power device and the emitter electrode pattern. The emitter lead is provided substantially in the center of the emitter electrode pattern so that the inductance component between the emitter electrode on the first power device and the emitter lead is substantially equal to that between the emitter electrode on the third power device and the emitter lead. The inductance component of the second connection means is adjusted so that the inductance component between the emitter electrode on the second power device and the emitter lead is substantially equal to that between the emitter electrode on the first power device and the emitter lead.

DETAILED DESCRIPTION OF THE PREFERRED EMBODIMENTS

First Preferred Embodiment

Figure 1:
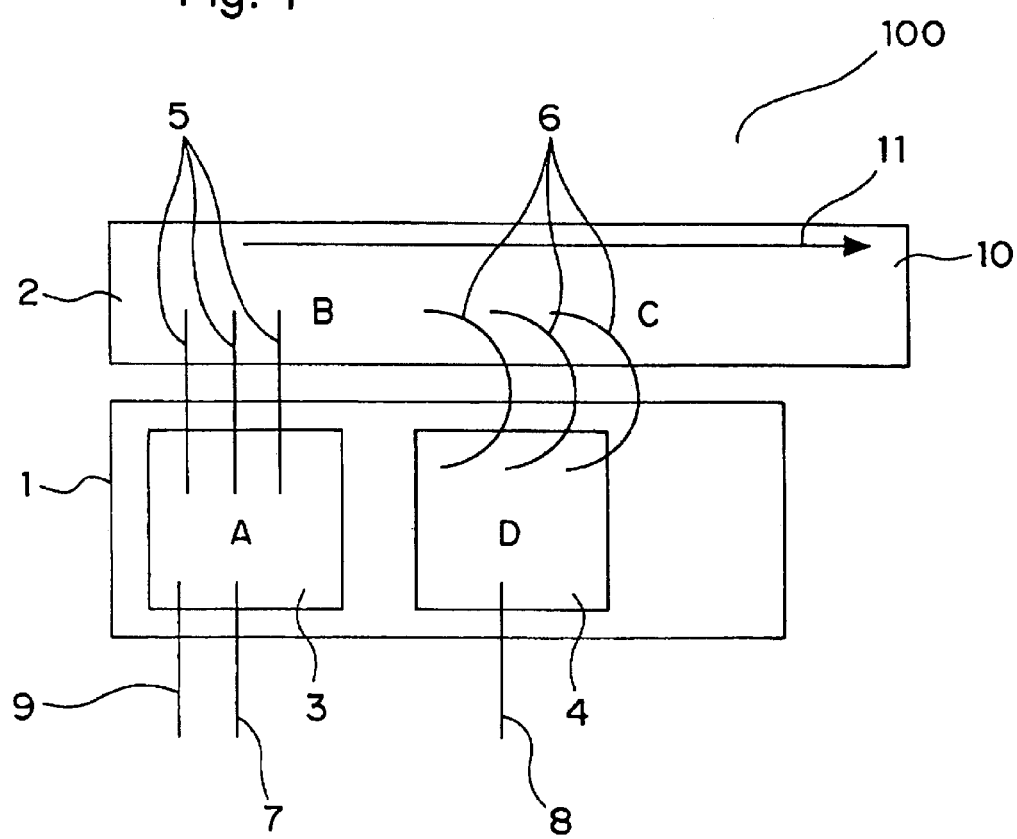
FIG. 1 shows a part of a power module in accordance with a first preferred embodiment of the present invention.
Figure 5:
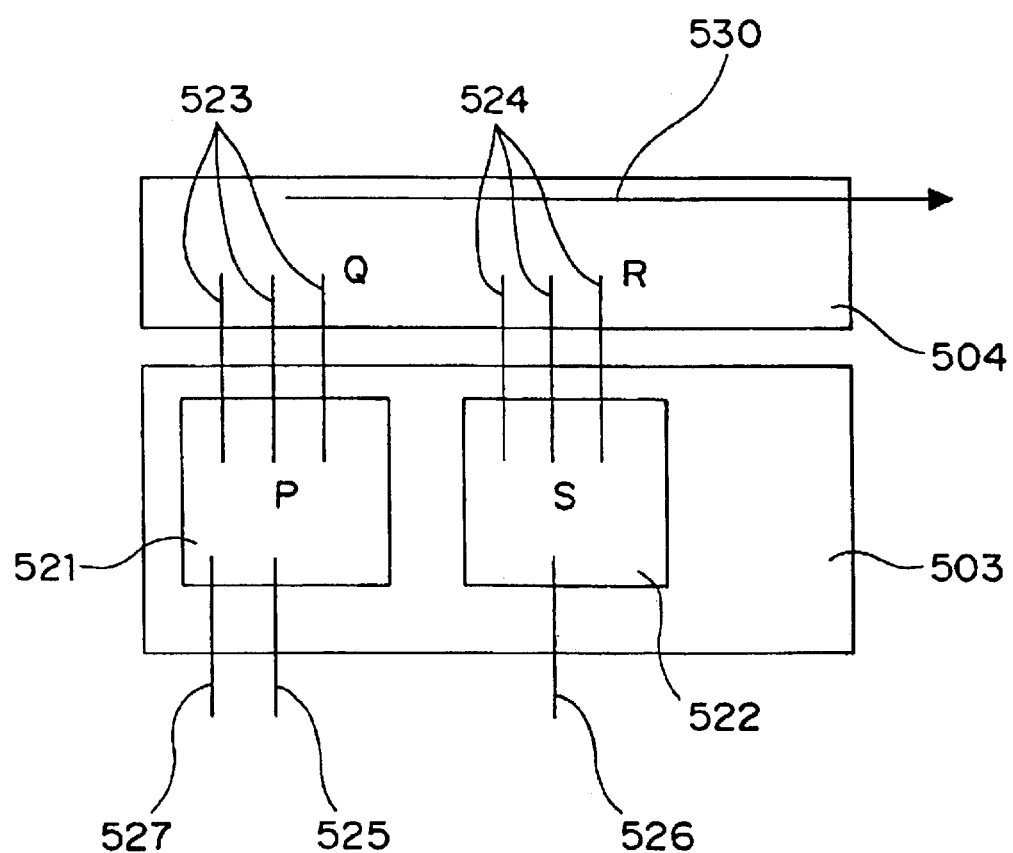
FIG. 5 shows a part of the power module with a conventional structure.

FIG. 1 shows a partial layout of a power module of this embodiment indicated in its entirety as 100. Other parts of this power module are structured as in the power module 500 shown in FIG. 5.

The power module 100 includes a collector electrode pattern 1 and an emitter electrode pattern 2 both provided on a ceramic substrate (not shown). At one end of the emitter electrode pattern, an emitter lead 10 is provided to lead out current.

Onto the collector electrode pattern 1, two IGBTs 3 and 4 are fixed. Each back face of the IGBTs 3 and 4 is a collector electrode. Each of the collector electrodes is electrically connected to the collector electrode pattern 1. Emitter electrodes on the front faces of the IGBTs 3 and 4 are connected to the emitter electrode pattern 2, via bonding wires 5 and 6, respectively. Gate electrodes on the IGBTs 3 and 4 are connected to a gate electrode pattern (not shown), via bonding wires 7 and 8, respectively. Furthermore, an emitter electrode on the IGBTs 3 is connected to a ground electrode (not shown), via a bonding wire 9.

In the power module 100, the bonding wires 6 are longer so as to increase the inductance component of the bonding wires 6. This structure makes the inductance component between the emitter electrodes on the IGBT 3 and the emitter lead 10 substantially equal to that between the emitter electrodes on the IGBT 4 and the emitter lead 10.

Thus, when the IGBTs 3 and 4 are switched by supplying gate signals at substantially equal electric potential via the bonding wires 7 and 8 into the gate electrodes on the IGBTs 3 and 4, respectively, the voltages applied between the respective gates and emitters on the IGBTs 3 and 4 are substantially equal to each other.

As a result, the IGBTs 3 and 4 are switched substantially at the same timing. This structure can prevent excessive load imposed one of the IGBTs, which have occurred in the conventional power device 500.

With reference to FIG. 1, this embodiment is specifically described. First, each electric potential at points A, B, C, and D is 0 V (ground potential) in the initial state.

Next, the IGBTs 3 and 4 are switched using the bonding wires 7 and 8, respectively, and brought to the ON state. Immediately after the switching, current flows from the point A to the point B, from the point B to the point C, and from the point D to the point C. Then, current flows through the emitter electrode pattern 2 toward the emitter lead 10 (shown by an arrow 11). At the same time, the inductance components cause voltage drop between the points A and B, and the other points.

However, in the power module 100, the bonding wires 6 are longer than the bonding wires 5, and thus have larger inductance components. This structure allows adjustment so that the sum of the voltage drop between the points A and B, and the points B and C is equal to the voltage drop between the points D and C.

As a result, the gate-to-emitter voltages on the two IGBTs 3 and 4 are substantially equal to each other, and the two IGBTs are switched without any timing lag.

For example, suppose the electric potential at the point A is 0 V. Then, the electric potential at the point B is −3 V and that at the point C is −5 V because of the influence of the voltage drop. On the other hand, voltage in the direction from the point C to point D is adjusted so as to increase by 5 V, and thus the electric potential at the point D is 0 V. Therefore, the gate-to-emitter voltages on the IGBTs 3 and 4 are both 15 V, immediately after the electric potential at both gates are changed from 0 V to 15 V. As a result, no timing lag occurs when the two IGBTs 3 and 4 are switched. Thus, excessive load is not imposed on one of the IGBTs at switching, and failures and shorter lives of the IGBTs can be prevented.

Since the bonding wires 5, 6, 7, 8, and 9 are typically made of aluminum, their layout can be changed highly freely. Therefore, changing r (radius) of the bonding stitch of the bonding wires 6 can easily change its inductance component.

In this embodiment, the inductance component is adjusted by changing the length of the bonding wires 6. However, the inductance component can also be adjusted by changing the sectional area of the bonding wires. Furthermore, the inductance component can also be adjusted by changing the length or sectional area of the bonding wires 5.

Second Preferred Embodiment

Figure 2:
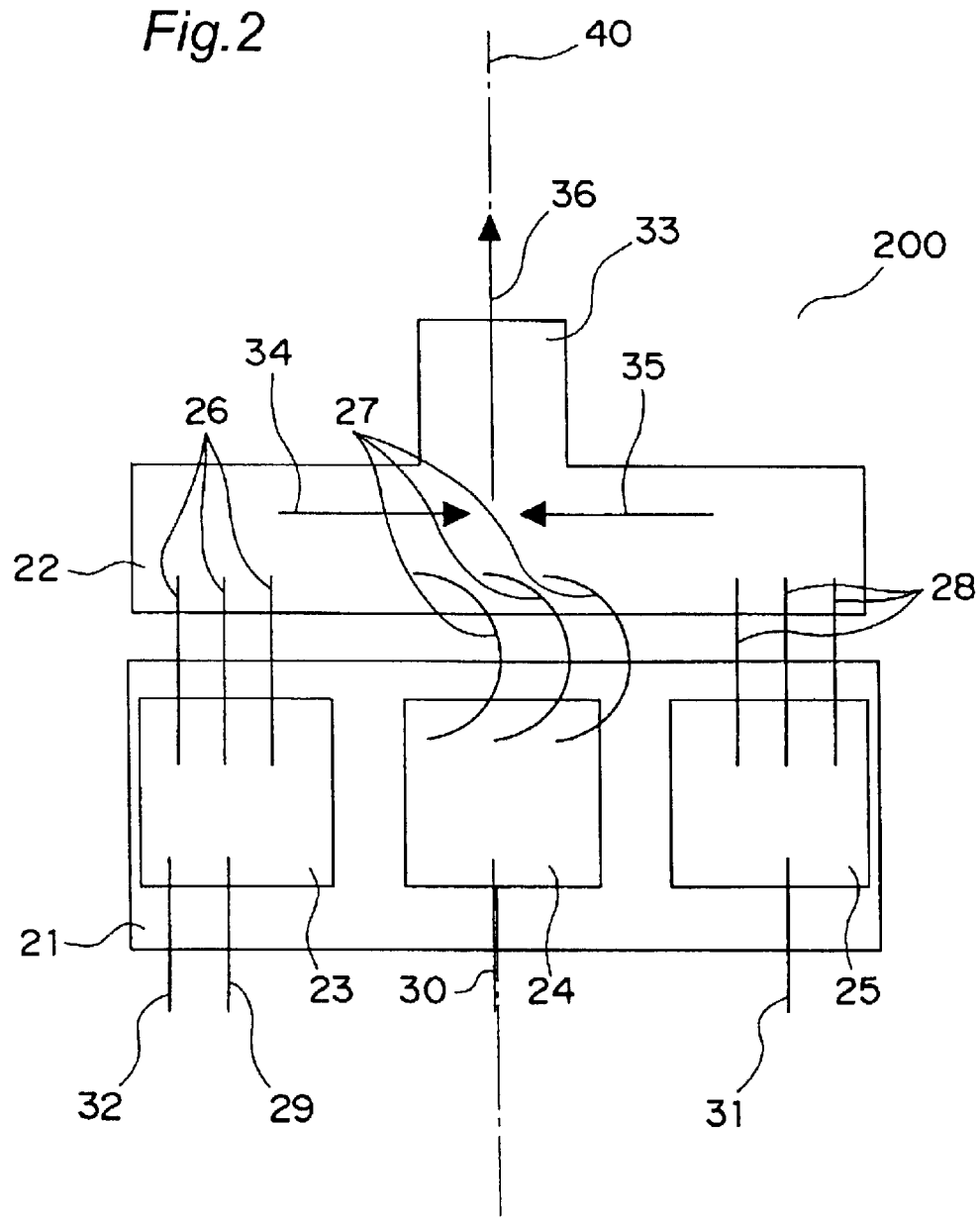
FIG. 2 shows a part of a power module in accordance with a second preferred embodiment of the present invention.

FIG. 2 shows a partial layout of a power module of this embodiment indicated in its entirety as 200. Other parts of this power module are structured as in the power module 500 shown in FIG. 5. Reference numerals 34, 35, and 36 show the directions of current.

The power module 200 includes a collector electrode pattern 21 and an emitter electrode pattern 22 both provided on a ceramic substrate (not shown). Substantially in the center of the emitter electrode pattern, an emitter lead 33 is provided substantially perpendicularly thereto to lead out current.

Onto the collector electrode pattern 21, three IGBTs 23, 24 and 25 are fixed. The IGBT 24 is fixed in a position opposite to the center of the emitter electrode pattern 22. The IGBTs 23 and 25 are fixed in symmetrical relation with each other so as to sandwich the IGBT 24. Each back face of the IGBTs 23, 24 and 25 is a collector electrode and electrically connected to the collector electrode pattern 21.

Respective emitter electrodes on the front faces of the IGBTs 23, 24 and 25 are connected to the emitter electrode pattern 22, via bonding wires 26, 27 and 28, respectively.

Gate electrodes on the IGBTs 23, 24 and 25 are connected to a gate electrode pattern (not shown), via bonding wires 29, 30 and 31, respectively. Furthermore, the emitter electrode on the IGBT 23 is connected to a ground electrode (not shown), via a bonding wire 32.

In the power module 200, the IGBTs 23 and 25 are arranged in substantially symmetrical relation with respect to a symmetry axis 40. This structure makes an inductance component between the emitter electrodes on the IGBT 23 and an emitter lead 33 substantially equal to that between the emitter electrodes on the IGBT 25 and the emitter lead 33.

On the other hand, the IBGT 24 has the bonding wires 27 longer enough to increase its inductance component. This structure allows adjustment so as to make the inductance components between the respective emitter electrodes on the IGBTs 23 and 25 and the emitter lead 33 substantially equal to that between the emitter electrodes on the IGBT 24 and the emitter lead 33.

Since the power module 200 has such a structure, when the IGBTs 23, 24, and 25 are switched by supplying gate signals at substantially equal electric potential via the bonding wires 29, 30, and 31 into the gate electrodes on the IGBTs 23, 24 and 25, respectively, the voltages applied between the respective gates and emitters on the IGBTs 23, 24, and 25 are substantially equal to one another. As a result, all the IGBTs 23, 24 and 25 are switched substantially at the same timing. This structure can prevent excessive load imposed on one of the IGBTs, which have occurred in the conventional power device 500.

Figure 3:
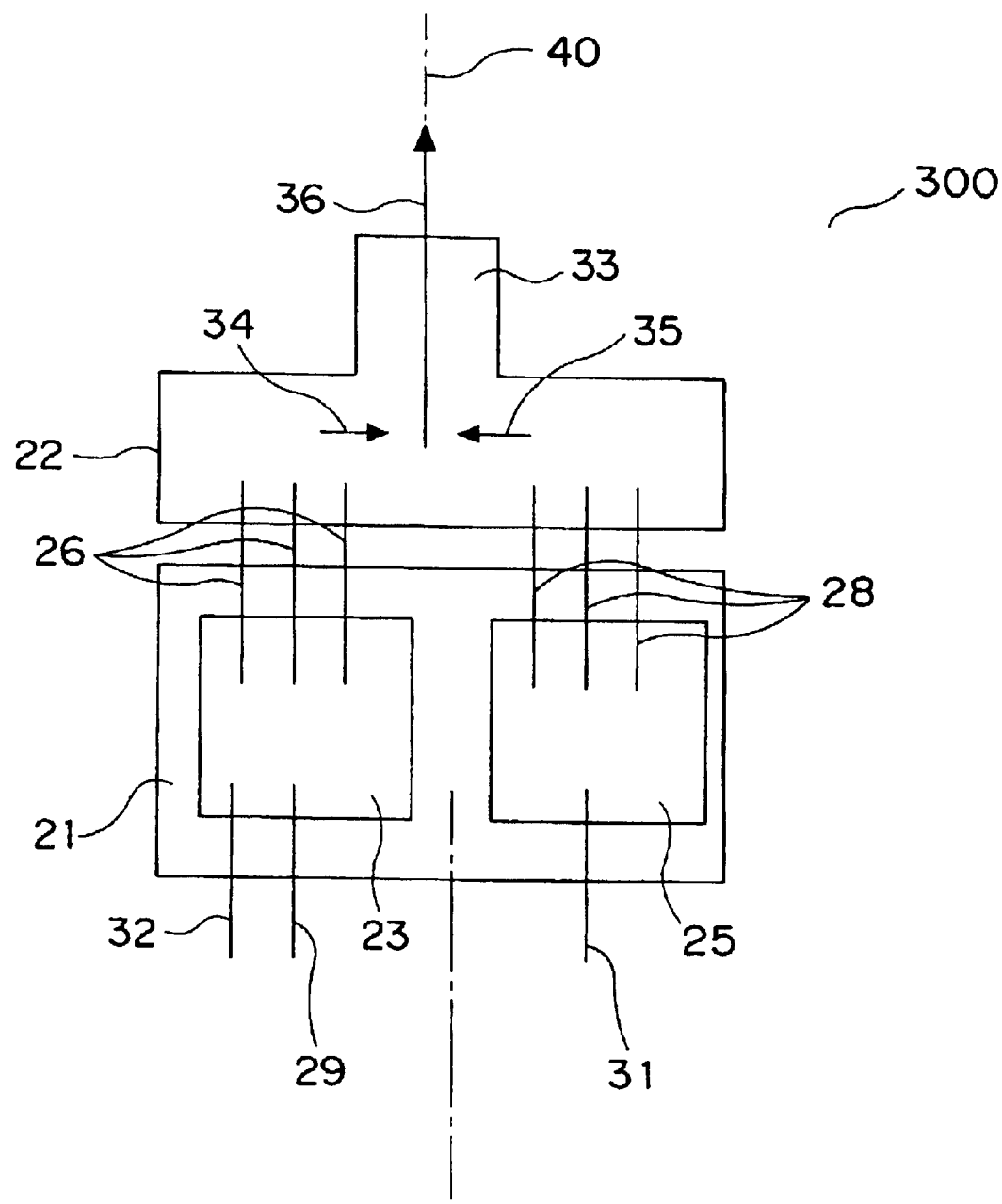
FIG. 3 shows a part of a power module with a conventional structure.
Figure 4:
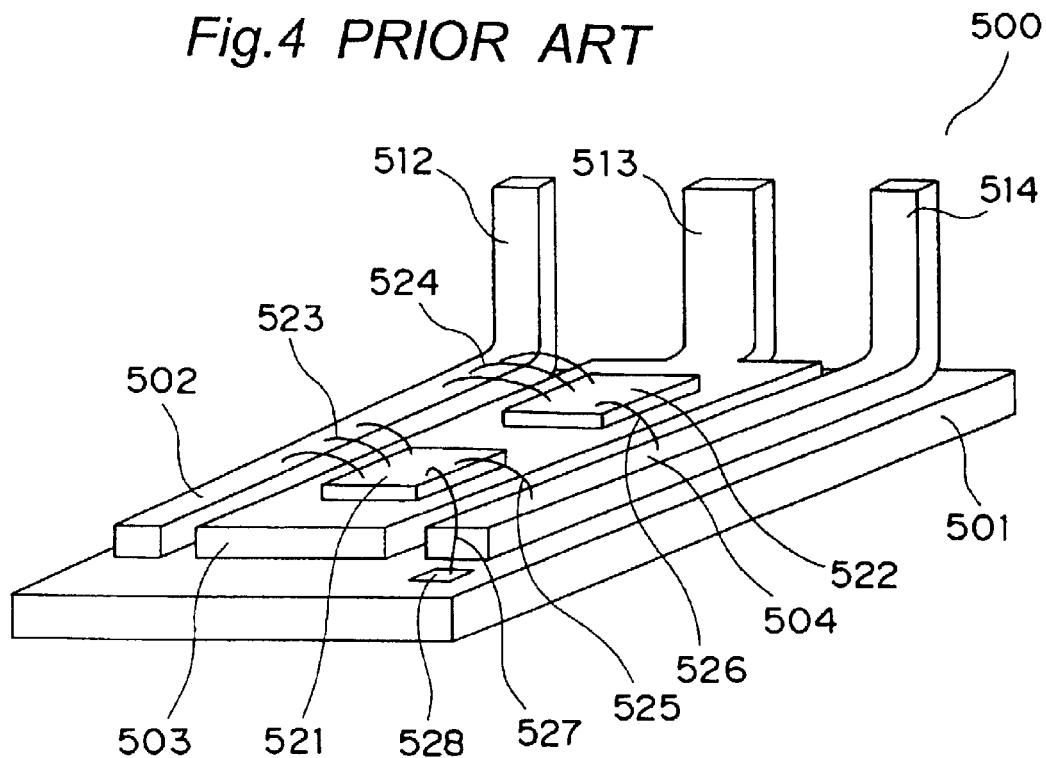
FIG. 4 is a schematic view of a power module with a conventional structure.

FIG. 3 shows a layout of a power module disclosed in JP, 61-139051, A and indicated in its entirety as 300. In FIG. 3, like reference numerals refer to similar or corresponding elements shown in FIG. 2. In the power module 300, the IGBTs 23 and 25 are disposed substantially in symmetrical relation with respect to the symmetry axis 40. This structure prevents a timing lag of switching the IGBTs 23 and 25. Thus, this structure is applicable only to the case where two IGBTs are used.

In contrast, the power module 200 of this embodiment is applicable to the cases where three or more IGBTs are mounted, because the IGBTs are disposed in symmetric relation with one another and the length or the like of the bonding wires is adjusted.

Described in the first and second preferred embodiments are the cases where IGBTs are used as power devices. Instead, other devices, such as power field-effect transistors (FETs), can be used.

Described in the above embodiments are the cases where the IGBTs and the emitter electrode pattern are connected by bonding wires. Instead, other connection means, such as a bonding film made of a film-like metal and other materials, can be used.

As mentioned above, in the power module of this invention, a plurality of power devices arranged in parallel with each other can be switched substantially at the same timing. This operation can prevent failures and shorter lives of the power devices. Particularly, the power module of this invention is applicable to the cases where three or more power devices are mounted.

What is claimed is:

1. A power module having a plurality of power devices arranged in parallel with each other and switched by gate signals with substantially equal electric potential, comprising:
   a collector electrode pattern;
   first and second power devices provided on the collector electrode pattern, each having a collector electrode connected to the collector electrode pattern;
   an emitter electrode pattern provided along the collector electrode pattern and having an emitter lead; and
   first and second connection wires configured to connect emitter electrodes on the first and second power devices and the emitter electrode pattern, respectively;
   wherein an inductance component of at least one of the first and second connection wires is adjusted by making the second connection wires longer than the first connection wires so that an inductance component between the emitter electrode on the first power device and the emitter lead is substantially equal to that between the emitter electrode on the second power device and the emitter lead.

2. A power module according to claim 1, wherein said emitter electrode pattern is substantially rectangular, and said emitter lead is provided at one end of said emitter electrode pattern.

3. A power module according to claim 1, wherein at least one of said first and second connection wires include a bonding wire and a length of the bonding wire is adjusted.

4. A power module according to claim 1, wherein at least one of said first and second connection wires include a bonding wire and a sectional area of the bonding wire is adjusted.

5. A power module according to claim 1, wherein said emitter electrode on said first power device is connected to reference electric potential.

6. A power module according to claim 1, wherein said power devices are insulated gate bipolar transistors.

7. A power module according to claim 1, further comprising:
   a third power device provided on said collector electrode pattern in symmetrical relation with said first power device so as to sandwich said second power device together with said first power device, and having a collector electrode connected to said collector electrode pattern; and
   third connection wires for connecting an emitter electrode on the third power device and said emitter electrode pattern,
   wherein said emitter lead is provided substantially in a center of the emitter electrode pattern so that an inductance component between the emitter electrode on the first power device and the emitter lead is substantially equal to an inductance component between the emitter electrode on the third power device and the emitter lead.

8. A power module according to claim 7, wherein said emitter electrode pattern is substantially rectangular, and said emitter lead is provided substantially in a center of the emitter electrode pattern substantially perpendicularly thereto.

9. A power module according to claim 7, wherein at least one of said first, second, and third connection wires include a bonding wire and a length of the bonding wire is adjusted.

10. A power module according to claim 7, wherein at least one of said first, second, and third connection wires include a bonding wire and a sectional area of the bonding wire is adjusted.

11. A power module according to claim 7, wherein said emitter electrode on said first power device is connected to reference electric potential.

12. A power module according to claim 7, wherein said power devices are insulated gate bipolar transistors.

13. A power module having a plurality of power devices arranged in parallel with each other and switched by gate signals with substantially equal electric potential, comprising:
   a collector electrode pattern;
   first and second power devices provided on the collector electrode pattern, each having a collector electrode connected to the collector electrode pattern;
   an emitter electrode pattern provided along the collector electrode pattern and having an emitter lead; and
   first and second connection wires configured to connect emitter electrodes on the first and second power devices and the emitter electrode pattern, respectively,
   wherein an inductance component of at least one of the first and second connection wires is adjusted by making the sectional area of the second connection wires larger than that of the first connection wires so that an inductance component between the emitter electrode on the first power device and the emitter lead is substantially equal to that between the emitter electrode on the second power device and the emitter lead.

14. A power module according to claim 13, further comprising:
   a third power device provided on said collector electrode pattern in symmetrical relation with said first power device so as to sandwich said second power device together with said first power device, and having a collector electrode connected to said collector electrode pattern; and third connection wires for connecting an emitter electrode on the third power device and said emitter electrode pattern, wherein said emitter lead is provided substantially in a center of the emitter electrode pattern so that an inductance component between the emitter electrode on the first power device and the emitter lead is substantially equal to an inductance component between the emitter electrode on the third power device and the emitter lead.

* * * * *